United States Patent
Ghyselen et al.

(10) Patent No.: US 7,169,683 B2
(45) Date of Patent: Jan. 30, 2007

(54) PREVENTIVE TREATMENT METHOD FOR A MULTILAYER SEMICONDUCTOR STRUCTURE

(75) Inventors: Bruno Ghyselen, Seyssinet-Pariset (FR); Olivier Rayssac, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 97 days.

(21) Appl. No.: 10/686,082

(22) Filed: Oct. 14, 2003

(65) Prior Publication Data

US 2005/0026391 A1    Feb. 3, 2005

(30) Foreign Application Priority Data

Jul. 30, 2003    (FR) .................... 03 09380

(51) Int. Cl.
*H01L 21/48*    (2006.01)
(52) U.S. Cl. .............. 438/455; 438/459; 438/406
(58) Field of Classification Search ......... 438/455, 438/459, 406
See application file for complete search history.

(56) References Cited

U.S. PATENT DOCUMENTS

| | | | |
|---|---|---|---|
| 4,771,016 A | | 9/1988 | Bajor et al. .............. 437/180 |
| 5,517,047 A | | 5/1996 | Linn et al. ............... 257/347 |
| 5,882,532 A | * | 3/1999 | Field et al. ................ 216/2 |
| 6,100,166 A | * | 8/2000 | Sakaguchi et al. ....... 438/455 |
| 6,309,945 B1 | * | 10/2001 | Sato et al. ............... 438/409 |
| 6,313,012 B1 | | 11/2001 | Horiuchi et al. .......... 438/459 |
| 6,410,938 B1 | | 6/2002 | Xiang ...................... 257/49 |
| 6,534,382 B1 | * | 3/2003 | Sakaguchi et al. ....... 438/455 |
| 6,902,656 B2 | * | 6/2005 | Ouellet et al. ......... 204/192.16 |
| 6,902,987 B1 | * | 6/2005 | Tong et al. ............... 438/455 |
| 6,979,630 B2 | * | 12/2005 | Walitzki .................. 438/459 |

| | | | |
|---|---|---|---|
| 2002/0070454 A1 | | 6/2002 | Yasukawa ................. 257/760 |
| 2004/0023468 A1 | | 2/2004 | Ghyselen et al. ......... 438/455 |
| 2005/0026391 A1 | * | 2/2005 | Ghyselen et al. ......... 438/455 |
| 2005/0191779 A1 | * | 9/2005 | Le Vaillant et al. ....... 438/24 |
| 2005/0196937 A1 | * | 9/2005 | Daval et al. .............. 438/455 |
| 2005/0224155 A1 | * | 10/2005 | Chen et al. .............. 156/73.1 |
| 2005/0245049 A1 | * | 11/2005 | Akatsu et al. ........... 438/458 |

FOREIGN PATENT DOCUMENTS

| | | |
|---|---|---|
| FR | 2823599 | 10/2002 |
| FR | 2 835 096 | 7/2003 |
| WO | WO 02084722 | 10/2002 |

(Continued)

OTHER PUBLICATIONS

N. Tate et al., "Defect Reduction of Bonded SOI Wafers by Post Anneal Process in $H_2$ Ambient," Proceedings 1998 IEEE International SOI Conference, pp. 141-142 (1998).

(Continued)

*Primary Examiner*—Laura M. Schillinger
(74) *Attorney, Agent, or Firm*—Winston & Strawn LLP (57) ABSTRACT

A preventive treatment method for a multilayer semiconductor structure having a support substrate, at least one intermediate layer and a surface layer in which the surface layer is to be subjected to a subsequent chemical treatment. The method includes forming a protective layer between the intermediate layer and the surface layer. The protective layer is made from a material chosen to be sufficiently resistant to the chemical treatment to protect the intermediate layer from chemical attack.

18 Claims, 3 Drawing Sheets

FOREIGN PATENT DOCUMENTS

WO     WO 03063214 A2     7/2003

OTHER PUBLICATIONS

Q-Y. Tong and U. Gosele, "Semiconductor Wafer Bonding Science and Technology", Wiley Interscience publication, Johnson Wiley & Sons, Inc.

O. Rayssac et al., "Application for specific semiconductor processes" SOI to SOIM Technology, Electrochemical Society Proceedings, vol. 2001-3, pp. 39-44 (2001).

Olivier Rayssac et al., "Influence of Surface Characteristics on Direct Wafer Bonding", LETI/CEA Department de Microtechnologies, Genoble, France.

* cited by examiner

PREVENTIVE TREATMENT METHOD FOR A MULTILAYER SEMICONDUCTOR STRUCTURE

BACKGROUND ART

The present invention relates to a method for forming a multilayer semiconductor structure intended for electronics, optics or optoelectronics that includes a buried or intermediate layer. In particular, the method includes forming a protective layer between the intermediate layer and a surface layer, wherein the protective layer is made from a material chosen to be sufficiently resistant to a chemical treatment to protect the intermediate layer from chemical attack In this document, a buried layer or intermediate layer means any layer included within a structure, which may include material above and below it, and having material properties significantly different from the properties of the adjacent material. Existing semiconductor structures for use with electronics, optics or optoelectronics frequently include an intermediate layer. For example, SOI (Silicon On Insulator) structures include a buried layer that is an electrically insulating layer which can be made of, for example, $SiO_2$ or $Si_3N_4$.

Techniques such as epitaxy, bonding wafers, and transferring or detaching thin layers, are used to manufacture such semiconductor structures or wafers. These techniques are usually used after, at the same time as, and/or before a chemical treatment is used. Chemical treatments are used for various reasons, such as for cleaning the wafer or for chemically etching one or several layers. In some cases, these chemical treatments may affect the quality of the overall structure, particularly when one or several of the intermediate layers or buried layers are etched. By definition, it seems that a buried layer would not come into contact with the outside of the structure (and therefore does not have any access paths to chemical species), but this is not always the case for some structures. In particular, a buried layer can be exposed to come into contact with the outside portion of the structure at an edge of the structure. In addition, a buried layer may be subjacent to a thin layer, and the surface of the thin layer is in contact with the exterior and includes some defects, all of which can provide access paths to the buried layer for chemical etching species. Such defects may occur due to the nature of the material of the thin layer, or may be caused by contaminants, precipitates, and the like.

These intrinsic problems with etching buried layers within structures occur particularly in cases in which the structures are provided with a particularly thin layer on the surface and on the buried layer. Such thin layers are typically on the order of a few tens of nanometers. The presence of defects in these thin layers can possibly have dramatic consequences on the quality of the final structure after the chemical etching treatment occurs.

This problem occurs particularly in chemical treatment that use hydrofluoric acid HF. For example, SOI (Silicon On Insulator) structures typically include a particularly thin useful layer of silicon on an $SiO_2$ layer, and a substrate typically made of silicon. HF-type etching is typically used on such structures for deoxidation, for example after an oxidizing heat treatment. If the thin silicon layer has defects like those mentioned above, the buried $SiO_2$ layer could be etched by the HF solution. A defect of 100 nanometers or more in a silicon layer of this type can provide access to the buried oxide. Consequently, holes may be formed having a diameter of several microns or several tens of microns in the oxide layer, due to the action or chemical attack of the chemical species, and these holes are referred to as "decorations" (for example, see cavities 17 and 17' in FIG. 2).

Therefore, defects in the useful layer, also called HF defects, can have a dramatic effect on the quality of the buried layer and on the entire structure. Those skilled in the art define these HF defects as being "killer" defects. Further, the presence of HF defects close to an $SiO_2$ buried layer can cause other detrimental effects in the case of removable substrates.

Production of removable substrates by controlling the bonding energy are described particularly in International Application Publication No. WO 02084722. The removable substrates are produced by reducing the bonding forces between a substrate and a wafer (or a thin layer) that are bonded together, so that the bonding forces are less than the optimum bonding forces. A weakened zone is created in the substrate—wafer (or layer) assembly to form the removable substrate. But several problems can occur when etching the buried $SiO_2$ by chemically treating (for example, by using an HF treatment) the removable substrate in which this type of weakened zone is located within a buried thickness of $SiO_2$. In particular, a problem can occur if the bonding energy has not been controlled sufficiently optimally, for example, if it is too weak. This will cause edge delamination problems, wherein silicon grains close to the periphery of the layer are etched off (for example, see FIG. 5). In addition; if HF defects are present in the layer subjacent to the buried $SiO_2$ thickness, then decorations are formed in the buried layers under the action of the HF chemical species. Due to bonding imperfections in the weakened zone, these decorations tend to become larger than they otherwise would have been if optimum bonding had occurred. Such decorations can be about 10 to about 100 times larger than in the case of a non-removable substrate, which may cause the thin layer above the decorations to loose its stiffness and tear. This can result in the presence of particles on the wafer and therefore pose contamination problems during later processes of the SOI structures, removable substrates or other structures (for example, see FIG. 7).

In an effort to overcome such chemical etching problems concerning buried layers, an attempt was made to improve the quality of the useful layers by reducing the defect density, to make it more difficult for chemical species to access the buried layer. Other techniques attempt to use chemical species that are less aggressive and thus that will not detrimentally affect the buried layer during the chemical treatment.

SUMMARY OF THE INVENTION

Presented is a preventive treatment method for a multilayer semiconductor structure having a support substrate, at least one intermediate layer and a surface layer, in which the surface layer is to be subjected to a subsequent chemical treatment. The method includes forming a protective layer between the intermediate layer and the surface layer. The protective layer is made from a material chosen to be sufficiently resistant to the chemical treatment to protect the intermediate layer from chemical attack.

In and advantageous embodiment, the multilayer semiconductor structure is formed by bonding a donor substrate to the support substrate and then transferring at least the surface layer from the donor substrate to the support substrate by a layer transfer technique. The intermediate and protective layers may be provided on a surface of at least one of the support substrate and the donor substrate before bonding. In particular, the intermediate layer may be provided on a bonding surface of one of the substrates and the protective layer provided on a bonding surface of the other substrate before bonding. The surface layer may be advantageously transferred by providing a weakened zone in the donor substrate at a depth sufficient to define the surface layer, bonding the surface layer of the donor substrate to the protective layer and then detaching the surface layer from the donor substrate. The weakened zone may be provided by at least one of implanting atomic species in the donor substrate to a predetermined depth, or by providing a porous layer in the donor substrate.

In a variation, the multilayer semiconductor structure is formed by bonding a donor substrate to the protective layer and then obtaining the surface layer by at least one of chemically etching, grinding, polishing, using CMP, or abrading the donor substrate. The structure may be a semiconductor-on-insulator structure, which has an intermediate layer that at least partly forms an insulating layer of the structure. At least a part of the intermediate layer may be made of $SiO_2$, and the intermediate layer may be formed by oxidation. In addition, the protective layer can form at least a part of the insulating layer of the structure, and could be made from a nitride material. In particular, the protective layer may be made of $Si_3N_4$ or SiON.

In another advantageous aspect of the invention, the multilayer semiconductor structure is formed by bonding a transfer structure to the support substrate. The protective layer may be formed by depositing a nitride on a bonding surface of the transfer structure or the support substrate, and may further include a weakened zone between two layers, wherein at least one of the two layers has a rough surface. A chemical treatment could be used to roughen the surface of at least one of the two layers before bonding, and the chemical treatment may be based on hydrofluoric acid.

Another implementation according to the invention concerns a preventive treatment method for a multilayer semiconductor structure having a support substrate, at least one intermediate layer and a surface layer. The surface layer is to be subjected to a subsequent chemical treatment. The improvement includes forming a protective layer between the intermediate layer and the surface layer, the protective layer being made from a material chosen to be sufficiently resistant to the chemical treatment to protect the intermediate layer from chemical attack.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

The present method is a technique that reduces the number and size of etching defects in the buried layer of a given structure, in the case wherein the structure is chemically treated. When a buried layer is etched, etching occurs locally and extends on delimited zones associated with specific features of the surrounding structures that can provide access paths for the chemical etching species to the buried layer. A buried layer is etched mainly as a result of the presence of nearby defects, particularly when the buried layer is subjacent to a thin layer. The buried layer may also be etched if the structure is exposed to the etching solution for a long period of time, and/or if a high proportion of chemical species is used that is capable of etching the material in the buried layer.

For example, inadvertent etching of a buried or intermediate layer can occur when the buried layer is adjacent to a thin layer having one of its surfaces in contact with the buried layer, and the other of its surfaces is in contact with the outside. The slightest defect present in such a thin layer, which may be only a few tens of nanometers thick, can provide an access path for etching species to the buried layer. These defects may be of different natures. For example, they may be defects that pass through the thin layer, thus providing direct access to the buried layer. These through defects may be of several origins, particularly related to the method of manufacturing the thin layer and the quality of the material from which it is formed. For example, it is known that an epitaxial layer contains few such through defects and therefore there is less risk of damaging the buried layer subjacent to it during chemical etching treatments.

However, in some, it is necessary to use a layer transfer technique to transfer the thin layer from a donor substrate onto a target substrate to make multilayer structures. This is the case particularly for methods of making SeOi (Semiconductor On Insulator) structures, since the thin layer is made from a semiconductor material and cannot be epitaxially grown on the insulating layer. Such techniques for transferring thin layers typically create ten times as many defects as epitaxy. Consequently, such structures have had problems concerning the etching of buried layers.

Figure 1:
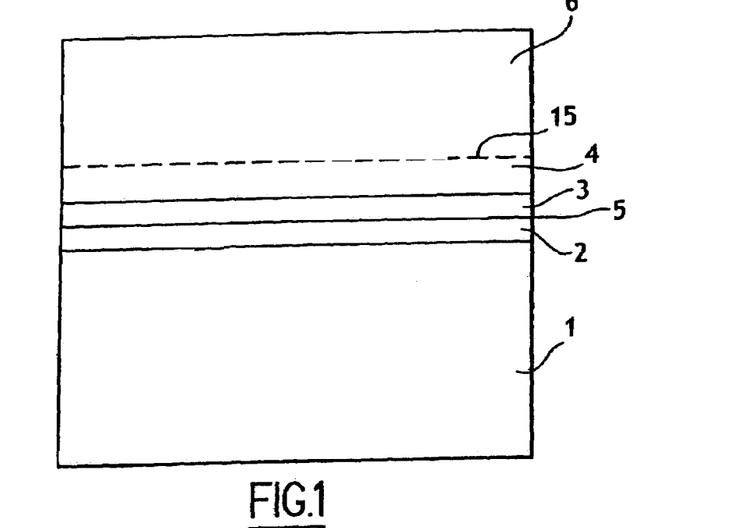
FIG. 1 shows two wafers or substrates bonded to each other, to illustrate the steps used in forming an SOI structure.

FIG. 1 illustrates a technique for transferring layers from a donor substrate 6 onto a receiver substrate 1 that typically uses two main steps. The first step concerns bonding the two substrates 1 and 6 at a bonding interface 5. After bonding, the donor substrate 6 is then reduced or partially removed to obtain a structure comprising the receiver substrate 1 and a thin layer 4 that is the remaining part of the donor substrate 6. Molecular bonding may be used.

High performance surface preparations may be used to improve the bonding energy between substrates 1 and 6, such as by exposing the surfaces to be bonded to a plasma (for example oxygen), cleaning, or brushing. The layers 2 and 3 can also be formed and a suitable heat treatment can then be applied on at least one of the two bonding surfaces, before bonding. For example, thermosetting glues could be applied, or glues that set by applying UV rays, or oxide layers could be formed, on the bonding surfaces.

The donor substrate 6 may be reduced or partially removed by progressively eliminating the donor substrate by polishing and/or chemical etching from the back (better known to those skilled in the art as the etch-back technique). A thin layer 4 of the donor substrate 6 could also be detached of the at a previously formed weakened zone 15 by applying heat and/or mechanical energy. The weakened zone 15 may be advantageously formed by controlled implantation of atomic and/or molecular species at the level of the weakened zone (for example, a SMART-CUT® technique could be used) or by forming a porous layer at a predetermined level. Such techniques for making wafers can cause defects to appear, such as through defects, in the thin layer 4. For example, a particle removed from the surface of the donor wafer 6 during polishing can abrade the thin layer 4 to reduce its thickness. In another example, chemical etching used during an etch-back method can also etch the surface of the donor wafer 6 unequally and expose the buried layer under the thin layer 4 at some locations.

The layer 4 formed on a porous weakened layer 15 may have isolated defects that are accentuated by subsequent treatment, such as the removal of the porous layer after detachment. Other advantageous finishing techniques for the thin layer 4 used after the donor wafer 6 has been reduced may also cause through defects. Possible finishing techniques include polishing, chemical etching, the use of an abrasive process, bombardment of atomic species, and sacrificial oxidation. However, other defects such as metallic contaminants, aggregates, oxygen precipitates, metallic precipitates and stack defects in the thin surface layer may still remain, and these defects may aid the infiltration of chemical etching species into the structure to reach the buried layer. Problems that such defects cause regarding conventional SeOI structures are described below with reference to FIGS. 2 and 3, along with solutions made possible by the present method.

Figure 2:
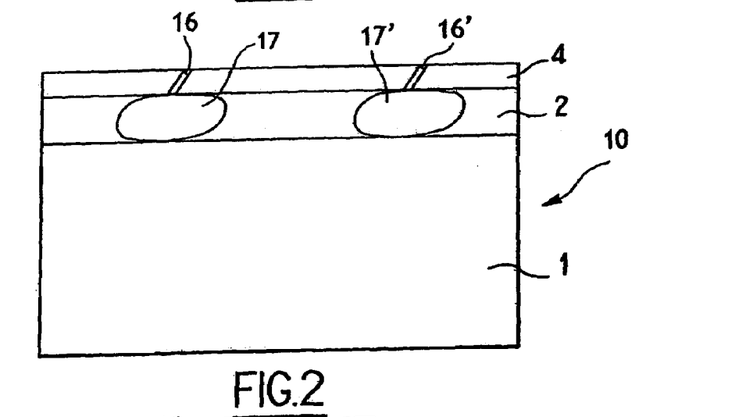
FIG. 2 shows a conventional SOI structure.

FIG. 2 illustrates a conventional SeOI structure 10 composed of a support substrate 1, an insulating buried layer 2 and a thin layer made of a semiconductor material 4. For example, this SeOI structure may be made according to an embodiment described above with reference to FIG. 1, wherein the bonding interface 5 is located within the buried layer 2 or at its surface. Several variant bonding techniques are described in the book entitled "Semiconductor Wafer Bonding Science and Technology" (Q- Y. Tong and U. Gosele, a Wiley Interscience publication, Johnson Wiley.& Sons, Inc.). This structure 10 contains defects in the thin layer that provide access for chemical etching species to reach the buried or intermediate layer 2. The defects 16 and 16' have been shown as being through defects in FIGS. 2 and 3 for reasons of clarity, but it should be understood that the defects represented in these figures could be of any other type, such as the presence of impurities like those mentioned above.

With reference to FIG. 2, the presence of defects 16 and 16' in the thin layer 4 will enable chemical species to reach the intermediate or buried layer 2 at the interface of layers 2 and 4. The chemical species will then locally etch the buried layer 2 and thus form cavities 17 and 17' respectively, also called "decorations". Components are to be fabricated in the thin layer 4, and the insulating buried layer 2 functions to provide these future components with specific properties. Consequently, the presence of these decorations 17 and 17' may reduce the quality of these future components. For example, this problem may occur in an SeOI structure in which the insulating buried layer 2 is made of $SiO_2$, and the chemical treatment applied to the structure employs a chemical solution comprising hydrofluoric acid HF. Such HF chemical treatments are frequently used in the field of semiconductors, particularly when a final deoxidation step is to be used on the surfaces of the structure 10, for example after the application of oxidizing heat treatments. Exposure of the structure 10 with defects 16 and 16' to etching with hydrofluoric acid will cause decorations 17 and 17' in the buried $SiO_2$ 2. Further, due to the ease of HF propagation along an unstable interface such as the interface between layer 2 and layer 4 at the defect 16, the decorations 17 and 17' may be much larger than the defects 16 and 16'. Thus, for defects 16 and 16' having average diameters of the order of 0.1 to 1 micron, an HF chemical treatment can create defects in the buried $SiO_2$ layer 2 with an average diameter of several microns, or even several tens of microns. Consequently, those skilled in the art classify such "HF" defects as "killer" defects, because they can irreversibly destroy a significant part of an SeOI structure 10.

Figure 3:
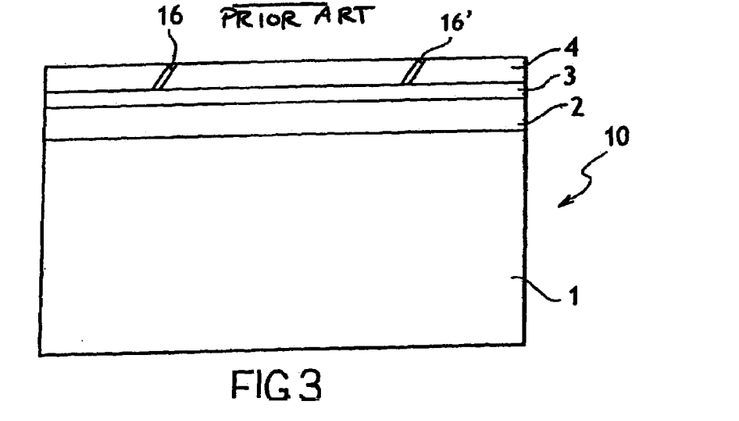
FIG. 3 shows an SOI structure according to the invention.

FIG. 3 illustrates the present method for protecting the buried layer 2 from a chemical attack. A layer or coating is applied between the buried layer 2 and the thin layer 4. This protective layer 3 is made from a material that is only very slightly etched or is not etched at all by the chemical species used during the chemical treatment that is applied to the structure 10. In particular, the protective layer 3 is resistant to the chemical species used in the treatment step that is capable of etching the buried layer 2.

The protective layer 3 may be provided using the techniques for making the above-mentioned thin layers, or by using other techniques. For example, the protective layer could be epitaxially grown if it is composed of a crystalline material, or may be provided by depositing atomic species on a surface.

The primary function of this protective layer 3 is to protect the intermediate or buried layer 2 against chemical attack. Therefore, the material and thickness of the protective layer are chosen primarily to give high resistance to the chemical species used for etching. Therefore, the protective layer 3 must be thicker than a minimum thickness below which there is a risk that too much of its thickness will be etched, and thus permit the chemical species to reach the intermediate layer.

Advantageously, the structure 10 is made according to one of the techniques described above with reference to FIG. 1 and using one of the mentioned bonding techniques. The intermediate layer 2 and/or the protective layer 3 are then formed before bonding.

In a first configuration, the intermediate layer 2 and the protective layer 3 are already provided in the wafers to be bonded, for example during previous epitaxial steps. In a second configuration, they are advantageously formed on the bonding surfaces of the wafers to be bonded. The intermediate or buried layer 2 is preferably formed on the surface of the first wafer, and the protective layer 3 is formed at the surface of the second wafer. Thus, the two layers 2 and 3 may act as bonding layers, in addition to their primary functions.

Referring again to FIG. 3, the thin layer 4 is identical to the thin layer of FIG. 2, and includes the same defects 16 and 16'. But the difference from that of FIG. 2 is that the protective layer 3 is not, or is only slightly, attacked by the chemical species used to etch the buried layer 2. In FIG. 3, since the chemical species infiltrate through the thin layer at defects 16 and 16' and terminate at the protective layer 3, these species do not reach the buried layer 2. Thus, the protective layer 3 very significantly reduces or prevents the intermediate or buried layer 2 from coming into contact with the chemical species. This result is achieved without attempting to improve the quality of the thin layer 4 (which has just as many defects 16 and 16' as that of the thin layer of FIG. 2), unlike conventional techniques. This result is also obtained without modifying the chemical composition of the treatment applied to the structure 10.

In one preferred configuration of the structure 10, the structure is an SeOI structure in which the buried layer 2 and possibly the protective layer 3 are made from an electrically insulating material. Therefore, both layers together form the insulating layer thickness of the SeOI structure. Such a SeOI structure is preferably made according to one of the techniques described above with reference to FIG. 1.

A bonding interface 5 preferably is implemented between the donor substrate 6 and the receiver substrate 1, and is covered by the protective layer 3 and the buried layer 2 respectively. If molecular bonding is used, then the protective layer 3, apart from being formed from a material that is not etched or is only slightly etched by the chemical etching species, must have a bonding performances that is practically identical to that of the buried layer 2 so that they can bond together, such that the bonding energies, creep properties and/or coefficients of thermal expansion are similar.

In comparison with the example described above with reference to FIG. 2 of an SeOI structure 10 in which the insulating layer 2 is an $SiO_2$ layer, an SeOI structure 10 according to the present method also comprises a protective layer 3 between the thin layer 4 and the insulating layer 2. The protective layer may be made from a semiconductor material or an electrically insulating material. The material of the protective layer 3 is advantageously an electrically insulating material, and together with the buried layer of $SiO_2$ forms the insulating thickness of the SeOI structure 10. In an implementation, the protective layer 3 is preferably made of $Si_3N_4$, SiON or diamond, which are insulating materials.

According to a preferred configuration, the protective layer 3 is made of $Si_3N_4$, since the bonding properties of this material are approximately equivalent to the bonding properties of $SiO_2$ in terms of bonding energy and transfer quality. This is particularly true in the case of implementation of a SMART-CUT® method, for example with reference to the document entitled "From SOI to SOIM Technology: application for specific semiconductor processes" by O. Rayssac et al. (in SOI Technology and Devices X, PV 01-03 ecs Proceedings, Pedington, and J (2001)).

Another advantage of using a nitride for the protective layer 3 is in its strong resistance to chemical treatments, such as to treatments using hydrofluoric acid. For example, the silicon nitride may be obtained by a nitride process or by depositing a nitride layer by CVD on the surface of the donor substrate 6. The intermediate layer 2 to be buried in the structure can be formed by oxidation of the surface of the receiver substrate 1.

A structure 10 is described below with regard to a long exposure to chemical etching species and/or exposure to a high proportion these chemical etching species,, which causes etching of the buried layer 2. Such a structure 10 is called a removable structure which has been defined, for example, in like that defined particularly in International Application Publication No. WO 02084722. A removable structure is composed of two wafers glued together which are removable by controlling the process used to bond the two wafers, and particularly by controlling the bonding energy. These removable structures are used mainly as temporary substrates for growth and/or for manufacturing layers or components before these layers and/or components are transferred onto receiver substrates. Thus, the final result may be a structure with a receiver substrate that could not have been used as a substrate for making these layers or transferred components if this removable structure technique had not been used, or that could only have been used with difficulty. Applications for removable structures exist in the field of light emitting diodes, for example, in which a removable sapphire substrate is removed by disassembly to make epitaxial stacks, these stacks then being transferred to another less electrically insulating substrate. Similarly, in the fields of telecommunications and applications using hyper frequencies, it is preferable if the components are finally integrated onto a support with a higher resistivity.

In some cases, the substrate necessary to make some structures or components is very expensive. For example, silicon carbide is much more expensive than silicon but resists higher temperatures, can be used in higher power applications, and is significantly better at handling maximum usage frequencies. Therefore, it would be advantageous to transfer a thin layer of silicon carbide that has been epitaxially grown on a sapphire substrate, onto an inexpensive substrate such as silicon. There are also applications for removable structures in the fields of power components or smart cards.

Figure 4:
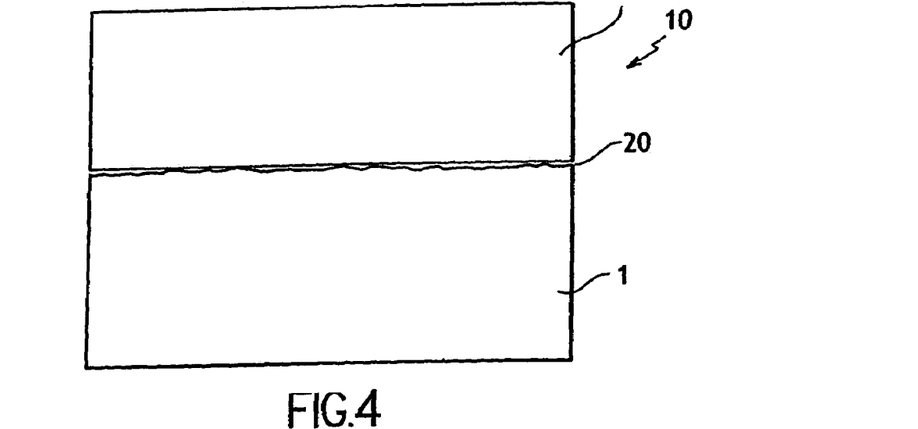
FIG. 4 illustrates a transfer structure bonded to a support substrate to form a removable structure.

FIG. 4 illustrates a removable structure 10 composed of a support substrate 1 linked in a controlled manner to a transfer structure 6 through a weakened zone 20. The weakened zone 20 may be created by roughening the surface of the removable substrate 1 by using a chemical treatment and possibly by roughening the transfer structure 6, prior to bonding the support substrate 1 and the transfer structure 6. Such a method is described in International Application Publication No. WO 02084722.

The extent of the weakening, or fragility of the structure, at the weakened zone 20 depends mainly on the chemical budget (identifying the chemical species, the duration of the application, and the temperature used). Equivalently, the final extent of the weakening can be determined by the loss of bonding energy in the weakened zone 20. The loss of bonding energy at the zone 20 is related to surface roughening that reduces the contact links between the removable substrate 1 and the transfer structure 6. Thus, the bonding energy of the removable substrate 1 can be controlled by varying the surface roughness.

Thus, for $SiO_2/SiO_2$ bonding in which the two layers were each roughened by 8000 Å HF etching leading to a roughness of the order of 0.625 nanometers RMS for each surface, the bonding energy is on the order of 500 $mJ/m^2$. This compares to a bonding energy of approximately 2 $J/m^2$ usually used for $SiO_2/SiO_2$ bonding without any roughening treatment, this result being derived from the article entitled "Proceedings of the $2^{nd}$ International Conference on Materials for Microelectronics" (IOM communication page 183, 1998) by Olivier Rayssac et al. After the surface of the support substrate 1 has been roughened, the transfer structure 6 is bonded onto the support substrate 1 by one of the techniques described above to obtain the removable structure 10. Treatments can then be made in the transfer structure 6, for example, to make all or some of the components.

In a next step, the transfer structure 6 is detached from the support substrate 1 at the weakened zone 20, particularly by applying mechanical type stresses, such as insertion of a blade at zone 20, or the use of a separation clip, or a gas flow stream, or a liquid flow stream. However, it is possible that there will be some deterioration at the zone 20 or at some other weak locations of the removable structure 10 during separation, particularly if mechanical forces are applied to help with separation. A structure and a separation method are suggested and described below with reference to FIG. 5 to prevent this from happening.

Figure 5:
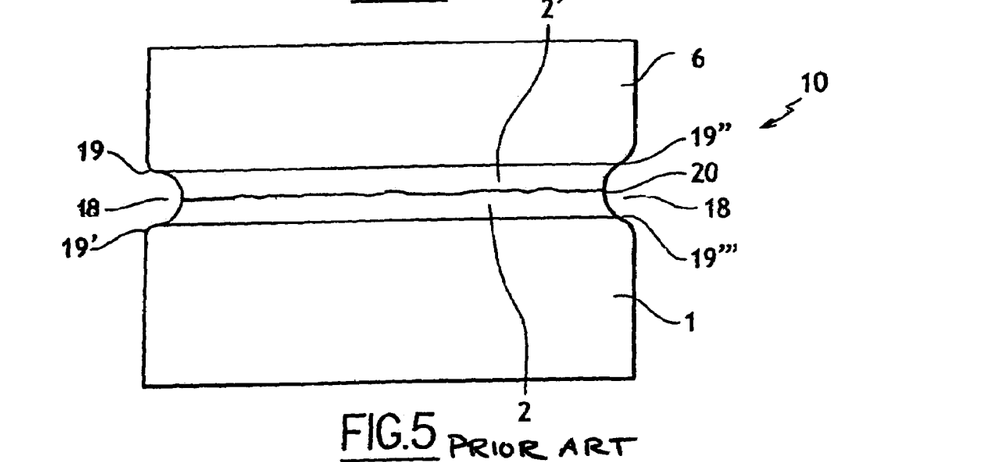
FIG. 5 shows a conventional removable structure.

Referring to FIG. 5, the removable structure 10 is composed of a support substrate 1 including a layer 2 at the surface, with a transfer structure 6 comprising a layer 2' at the surface. The weakened zone 20 is located at the interface of the layers 2 and 2', and can be made according to one of the two techniques described above with reference to FIG. 4. In this implementation, the layers 2 and 2' are made from the same material. The entire removable structure 10 is then subjected to a chemical treatment during or at the end of a fabrication process (for example, for making components), comprising chemical species capable of etching layers 2 and 2'. The chemical action of these species is made particularly effective if either the removable structure 10 is exposed to the chemical species for a long period of time, or if a particularly high proportion of chemical species is used. The action of the chemical treatment excavates the layers 2 and 2' laterally, at the position at which they are exposed at the edge of the removable structure 10. As shown, the recesses 18 and 18' are thus formed which accentuate the fragility or weakness of the weakened zone 20, and in particular will play a role in initiating detachment at zone 20 when mechanical forces are applied. The results of the chemical treatment are particularly difficult to overcome with regard to wafer detachment problems. In addition, edge delamination problems, in other words the unintentional removal of material belonging to the transfer structure 6 and/or the support substrate 1, can then affect the electronic or optoelectronic components that are to be fabricated later. With reference to FIG. 5, the delamination zones that illustrate this problem can be seen at 19, 19', 19" and 19'''.

For example, consider the example of a removable substrate 1 for which the oxidized surface 2 is roughened and then bonded to a transfer substrate 6 that has also been oxidized on the surface 2". The layers 2 and 2' are then $SiO_2$ layers. In this case, the removable structure 10 is subjected to HF treatment with a hydrofluoric acid content equal to about 50%, which is a particularly high concentration, which has the effect of laterally etching the $SiO_2$ layers 2 and 2" to be bonded. The delamination zones 19, 19', 19" and 19''' are then delaminations of the silicon in the transfer substrate 6 and the support substrate 1.

Figure 6:
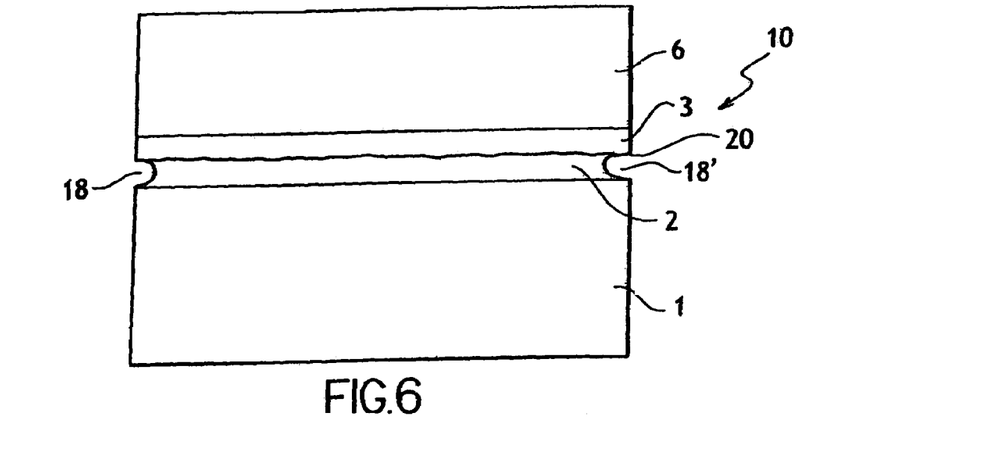
FIG. 6 shows a structure according to the invention.

FIG. 6 illustrates a solution to the problem mentioned concerning FIG. 5 above, by using a structure and a method according to the invention. The removable structure 10 is built up in the same way as the removable structure 10 described in detail above with reference to FIG. 5, except that the layer 2' is replaced by a protective layer 3 made from a material quite different from the material of layer 2. The material in the protective layer 3 is chosen such that chemical species used during the chemical treatment cannot etch the protective layer. Thus, when a chemical treatment is applied to the removable structure 10, only the layer 2 is etched laterally. This very significantly limits the amplitude of the lateral attack, since only one of the two buried layers is etched significantly, although the capability of initiating separation of the support substrate 1 from the transfer structure 6 is kept intact. Delamination at the support substrate 1 is then not very important, and there is no edge delamination at the interface between the transfer structure 6 and the protective layer 3.

In contrast to the removable structure 10 discussed above with reference to FIG. 5 and comprising two interface layers 2 and 2' made of $SiO_2$, the example illustrated in FIG. 6 has a layer 2' made of $Si_3N_4$ instead of $SiO_2$. This removable structure 10 is advantageously obtained by bonding the support substrate 1 previously oxidized at its silicon surface to provide the oxide layer 2, and the transfer structure 6 previously covered by an $Si_3N_4$ deposit (for example, by using PECVD or LPCVD) at its silicon surface to provide the nitride layer 3. In a first case, the weakened zone 20 is obtained by roughening the oxide layer 2 before bonding, by HF etching. In a second case, the weakened zone 20 is obtained by roughening the nitride layer 3 before bonding, for example by etching with $H_3PO_4$ at 140° C., or by dry etching using ballistic and/or chemical means such as reactive ionic etching (RIE). In a third case, the weakened zone is obtained by roughening the layer 2 of $SiO_2$ and the layer 3 of $Si_3N_4$.

Figure 7:
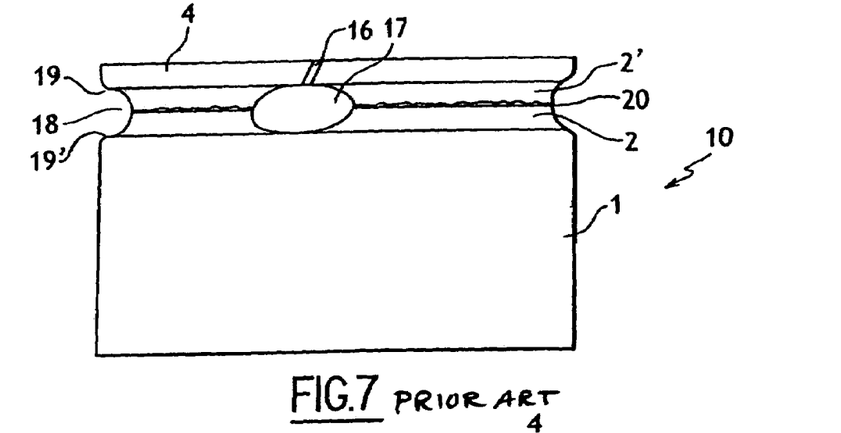
FIG. 7 shows a conventional removable SOI structure.
Figure 8:
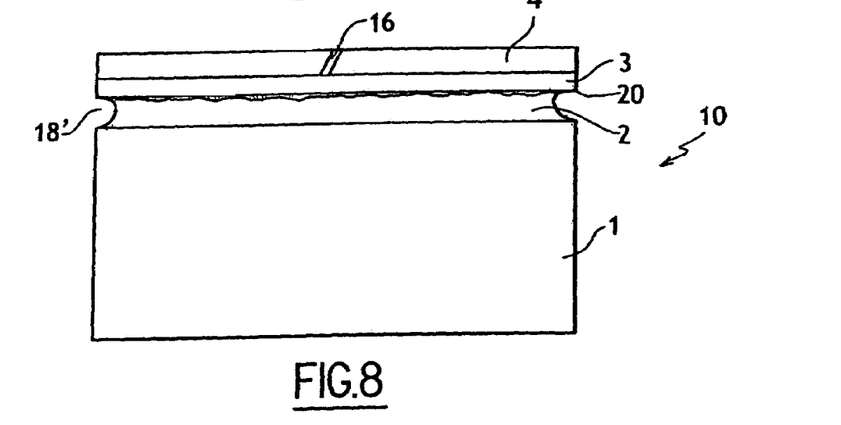
FIG. 8 shows a removable SOI structure according to the invention.
Figure 9:
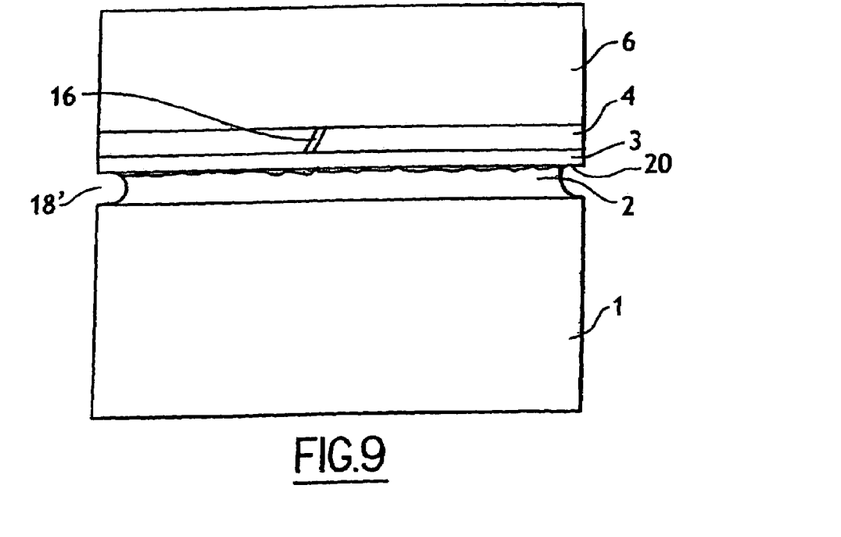
FIG. 9 shows a transfer structure glued to a removable structure.

FIGS. 7, 8 and 9 will be used below to describe the case of a chemical treatment on removable SeOI structures 10 comprising a support substrate 1 adjacent to the insulating thickness in which the weakened zone 20 was created, thus separating the insulating thickness composed of two layers 2 and 2', and finally the thin layer 4 of the SeOI structure. In a similar manner to that discussed with reference to FIG. 2, a particularly thin layer with defects can allow chemical species used in a chemical treatment to penetrate through its defects, so that the chemical species etch the buried insulating thickness 2 and 2'. A particularly active chemical treatment may create an annular cavity in the structure 10 at the weakened zone 20 by either exposing the structure 10 to chemical species for a prolonged period, or by exposing the structure to a high proportion of chemical species.

FIG. 7 illustrates a combination of the problems mentioned separately above, namely an appearance of decorations within the buried layer 2–2' and edge delamination at 19 and 19' of the thin layer 4 and the removable substrate 1. However, the decorations for a removable SeOI are larger than for a non-removable SeOI structure because the weakened zone 20 includes hollow parts (caused by interface roughness obtained by weakening by surface roughening) into which chemical etching species will penetrate to attack the walls and enlarge the hollow parts. Thus, in the case of a conventional removable SeOI, etching by chemical species can lead to typical decorations that are 10 to 100 times larger than in the case of a non-removable SeOI.

With reference to FIG. 8, the present method inserts a protective coating or layer 3 into the structure 10. The protective coating is made of a material that is not etched or is only slightly etched by the chemical species that will be used to etch the buried layer 2. This protective layer 3, like that shown in FIG. 3, isolates the buried layer from the defect 16 and therefore almost entirely prevents etching of the buried layer "from the inside". In addition, due to the reduction in the intermediate thickness between the thin layer 4 and the removable substrate 1, the annular recess 18' is smaller than the recess shown with reference to FIG. 7. This occurs because the edge delamination of the removable substrate is non-existent or is minimal. Further, the edge delamination of the thin layer 4 is approximately zero, while the annular recess maintains the property of initiating separation at the weakened zone 20 when mechanical separation forces are applied.

This type of removable SeOI structure may be used to implement embodiments of electronic or optoelectronic components in the thin layer 4. This structure 10 may be particularly attractive if these component layers are made at high temperatures, which only a few types of substrates can resist.

With reference to FIG. 9, the layer 4 can be transferred onto a transfer structure 6 by bonding the transfer structure 6 to the layer 4, and then by separating the entire assembly at the weakened zone 20. Finally; the protective layer 3 is removed. The result is a final structure containing a thin layer 4 on a transfer structure 6.

The substrates 1 and 6 discussed in this document and particularly with reference to FIGS. 1 to 9, may be made from silicon, germanium, SiGe, an IV—IV alloy, an III–V alloy, an II–VI alloy, sapphire, SiC or from any other material that can be used by this invention.

The thin layers 4 discussed in this document particularly with reference to FIGS. 1 to 3 and 7 to 9, may be made from Si, Ge, SiGe, an III–V alloy, an II–V alloy, SiC or from other materials.

The buried layers 3 are advantageously made from $SiO_2$ but they can also be made from any other type of insulator material or any other type of material that can be significantly etched by the chemical species used during chemical treatment of the structures 10.

The buried protective layer 3 is advantageously made from $Si_3N_4$ in the special case of the buried layer 2 being made from $SiO_2$, but it may also be made from SiON, diamond or other types of material that are only slightly etched by the chemical species used during treatment of the structure 10.

It should also be understood that the present method is applicable not only to manufacturing an SeOI structure, but also to any other embodiment of a structure intended for electronics, optics or optoelectronics.

What is claimed is:

1. A preventive treatment method for a multilayer semiconductor structure that includes a support substrate, at least one intermediate layer of insulator material and a surface layer of semiconductor material in which the surface layer is to be subjected to a subsequent chemical treatment, which method comprises: forming a protective layer between the intermediate layer and the surface layer, with the protective layer being made from a material chosen to be sufficiently resistant to the chemical treatment to protect the intermediate layer from chemical attack during the subsequent chemical treatment of the surface layer of the multilayer semiconductor structure; forming a structure by bonding a donor substrate to the support substrate; and then transferring at least the surface layer from the donor substrate to the support substrate by a layer transfer technique to form the multilayer semiconductor structure.

2. The method of claim 1 which further comprises providing the intermediate and protective layers on a surface of at least one of the support substrate and the donor substrate before bonding.

3. The method of claim 1 which further comprises providing the intermediate layer on a bonding surface of one of the substrates and the protective layer is provided on a bonding surface of the other substrate before bonding.

4. The method of claim 1 wherein the surface layer is transferred by providing a weakened zone in the donor substrate at a depth sufficient to define the surface layer, bonding the surface layer of the donor substrate to the protective layer and then detaching the surface layer from the donor substrate.

5. The method of claim 4 wherein the weakened zone is provided by at least one of implanting atomic species in the donor substrate to a predetermined depth, or by providing a porous layer in the donor substrate.

6. The method of claim 1 which further comprises forming the multilayer semiconductor structure by bonding a donor substrate to the protective layer and then obtaining the surface layer by at least one of chemically etching, grinding, polishing, using CMP, or abrading the donor substrate.

7. The method of claim 1 wherein the intermediate layer at least partly forms an insulating layer of the structure.

8. The method of claim 7 wherein at least a part of the intermediate layer is made of $SiO_2$.

9. The method of claim 7 which further comprises forming the intermediate layer by oxidation.

10. The method of claim 1 wherein the protective layer forms at least a part of the insulating layer of the structure.

11. The method of claim 1 wherein the protective layer is made from a nitride material.

12. The method of claim 11 wherein the protective layer is made of $Si_3N_4$ or SiON.

13. The method of claim 1 wherein the layer transfer is facilitated by providing the donor substrate with a weakened zone beneath the layer that is to be transferred to the support substrate.

14. The method of claim 1 wherein the protective layer is formed by depositing a nitride on a bonding surface of the donor substrate or the support substrate.

15. The method of claim 1 which further comprises providing the multilayer structure with a weakened zone at the bonding interface by providing at least one of the two layers with a rough surface.

16. The method of claim 15 which further comprises utilizing a chemical treatment to roughen the surface of at least one of the two layers before bonding.

17. The method of claim 1 wherein the chemical treatment of the surface layer includes a chemical treatment based on hydrofluoric acid.

18. In a preventive treatment method for a multilayer semiconductor structure having a support substrate, at least one intermediate layer and a surface layer with the multilayer semiconductor structure being made by bonding a donor substrate to the support substrate and then transferring at least the surface layer from the donor substrate to the support substrate by a layer transfer technique and in which the surface layer is to be subjected to a subsequent chemical treatment, the improvement which comprises forming a protective layer between the intermediate layer and the surface layer, with the protective layer being made from a material chosen to be sufficiently resistant to the chemical treatment to protect the intermediate layer from chemical attack during the subsequent chemical treatment of the surface layer.

* * * * *